Aug. 14, 1962 R. W. REACH, JR 3,049,629

ELECTRICAL PULSE AMPLIFYING AND RESHAPE APPARATUS

Filed Feb. 11, 1958

INVENTOR.
ROY W. REACH JR.
BY Henry L. Hanson
ATTORNEY

3,049,629
ELECTRICAL PULSE AMPLIFYING AND RESHAPE APPARATUS

Roy W. Reach, Jr., South Sudbury, Mass., assignor to Minneapolis-Honeywell Regulator Company, Minneapolis, Minn., a corporation of Delaware Filed Feb. 11, 1958, Ser. No. 714,562
9 Claims. (Cl. 307—88.5)

Figure 1:
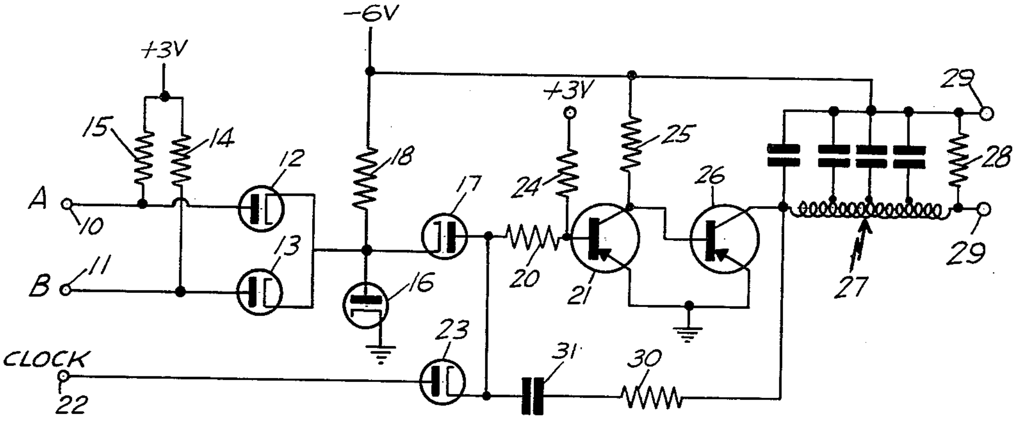

A general object of the present invention is to provide a new and improved apparatus for amplifying and reshaping an electrical pulse signal. More specifically, the present invention is concerned with a new and improved electrical pulse amplifying circuit which is characterized by its ability to produce a uniform or standard type of output pulse from non-uniform input signals utilizing transistor elements connected in a circuit configuration which makes full use of the switching capabilities of transistors.

Electrical pulses are widely utilized in various types of electrical and electronic apparatus for the conveying of, or representation of, information. Such pulses are frequently combined or compared with other pulses and, depending upon the circuit configuration, may be required to produce a single output pulse. In many types of pulse handling circuits wherein logical functions are to be performed, such as an electronic data processing apparatus, numerous electrical pulse sources may be combined on the input of a particular logical element. Frequently, the input pulses in such a data processing apparatus may be of non-uniform dimension and phasing such that the use of normal pulse amplifying circuits would produce non-uniform output pulses.

In accordance with the teachings of the present invention, there has been provided a new and improved dynamic logical type element utilizing transistor elements as the active switching elements of the combination. To produce the desired output pulse of uniform dimension and phasing, the circuit has been arranged so that once the dynamic portion of the combination has been triggered into action, it will remain in action and be controlled solely by a standard clock pulse of substantially constant dimension and phasing. Such a circuit as this has been provided by utilizing transistor devices in a regenerative circuit configuration where the time length of the regeneration is a direct function of a clock pulse applied to the circuit.

It is therefore a further more specific object of the present invention to provide a new and improved pulse amplifying and reshape circuit utilizing a pair of transistor elements connected in a regenerative circuit configuration where the regeneration is timed by a clock or timing pulse applied to the circuit.

The circuit for the present invention further provides a new and novel combination of transistor elements connected in driving relation to a delay line. It has heretofore been common practice to utilize transistors for driving delay lines where the coupling between the delay lines and the transistors was by way of a coupling transformer. The utilization of a coupling transformer in such a configuration presents numerous problems including the problem of "ringback" signal which is inherently produced by transformers, as well as the adverse effect a transformer has on the wave shape of the signal. As illustrated in the present invention, the connection of the delay line to the amplifying circuit is such that a transistor of the amplifying circuit is connected directly to the delay line. When so connected, the transistor can act as a full power switch directly connected into the delay line and consequently the transistor will be functioning in an optimum manner.

It is therefore a still further more specific object of the present invention to provide a new and improved pulse reshape circuit utilizing transistors wherein the output transistor is connected directly to an output delay line.

The foregoing objects and features of novelty which characterize the invention as well as other objects of the invention are pointed out with particularity in the claims annexed to and forming a part of the present specification. For a better understanding of the invention, its advantages and specific objects attained with its use, reference should be had to the accompanying drawings and descriptive matter in which there is illustrated and described a preferred embodiment of the invention.

Figure 2:
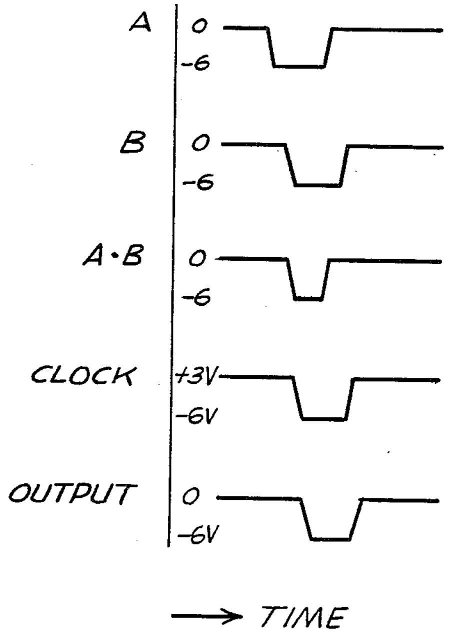

Of the drawings:

FIGURE 1 is a schematic representation of a preferred form of the present invention; and FIGURE 2 illustrates representative wave forms that may be associated with the apparatus of FIGURE 1.

Referring first to FIGURE 1, the numeral 10 represents one input terminal to which an input function A may be applied. It is assumed that the input function is an electrical pulse having a negative wave form. Such a wave may, for example, swing between 0 volts and −6 volts, in the particular configuration illustrated. A further input terminal 11 is provided for a further input function B, the latter also adapted to be represented by an electrical negative going pulse with the same general character as that of the function A. The two input terminals 10 and 11 are connected to a pair of gating diodes 12 and 13, the latter having their anode sides connected to a +3 volt bias source by way of a pair of resistors 14 and 15, respectively. The cathode sides of the diodes 12 and 13 are connected together to a further diode circuit which comprises a clamping diode 16, a coupling diode 17, and a pull-up resistor 18, the latter being connected at one end to a −6 volt supply voltage source. Diode 17 is coupled by way of a resistor 20 to the input base electrode of a transistor device 21. The transistor device includes, in addition to the base, the usual emitter and collector electrodes. Also coupled to the base of the transistor 21, by way of the resistor 20, is a clock pulse source, the latter being applied to the base by way of the terminal 22 and a diode 23 to the resistor 20 and then to the base of the transistor 21. A further resistor 24 is coupled between the base of the transistor 21 and a +3 volt biasing voltage source, the latter source functioning to provide a noise clipping bias on the input of the transistor 21. This +3 volt voltage source may also be used as an adjustable source to provide marginal checking facilities for the circuitry.

The emitter of the transistor 21 is connected to ground while the collector of the transistor 21 is coupled by way of a load resistor 25 to a −6 volt supply voltage source. The collector of the transistor 21 is also coupled to the base of a further transistor 26, the latter also including the usual base, emitter, and collector-electrodes of a transistor. The emitter of the transistor 26 is connected to ground while the collector is connected to the input of a delay line 27. The delay line 27 is illustrated as an L-C delay line having a terminating resistor 28 across the output terminals 29.

A feedback connection is provided for the amplifier and reshape circuit and takes the form of a series connected resistor 30 and condenser 31, said elements being connected from the collector of the transistor 26 back to the base of the transistor 21 through the coupling resistor 20.

In considering the operation of the circuit of FIGURE 1, the circuit should first be considered in its quiescent or steady state. It is thus assumed that there are initially no input signals applied to either of the input terminals 10 and 11 and that the clock signal is present in the form of a +3 volt biasing signal prior to the negative excursion of the clock pulse. The +3 volt signal on the terminal 22 will be reflected through the diode 23 and applied by way of the resistor 20 to the base of the transistor 21. This potential on the transistor 21 will maintain this transistor nonconducting. Consequently, the collector voltage on the transistor 21 will be substantially that of the conducting base voltage on the transistor 26. The base electrode of transistor 26 when so biased will cause the transistor 26 to be heavily conducting.

As soon as the negative going portion of the clock pulse is applied to the terminal 22, the diode 23 will be cut off. With the diode 23 cut off, the impedance thereof will be relatively high and the negative portion of the clock pulse will not be coupled into the base of the transistor 21. Consequently, the apparatus will remain in the steady state condition and there will be no change in the output of the transistor 26 on the delay line 27 or on the output terminals 29.

As soon as the voltage level from the clock pulse source on the terminal 22 returns to a +3 volts, the diode 23 will again be conducting so that a +3-volt signal will be applied to the base of the transistor 21. However, the circuit condition will not change.

If two negative going electrical pulses, representing the functions A and B, are applied at substantially the same time to the terminals 10 and 11, the diodes 12 and 13 will be rendered nonconducting and the −6 volt power supply signal will be coupled by way of resistor 18 through the diode 17 to the resistor 20. However, the −6 volt signal will not be effective on the base electrode due to the fact that the clock diode 23 will be conducting and maintaining the base of the transistor 21 positive. As soon as the clock pulse begins with the −6 volt signal on the terminals 22, the diode 23 will be cut off and the −6 volt signal from the gating circuit will then be applied to the base electrode of the transistor 21. With the negative signal on the base of the transistor 21, this transistor will be rendered conducting and when so conducting, the base of the transistor 26 will be switched in a positive direction to thereby switch the transistor 26 to be substantially cut-off.

When the transistor 26 is substantially cut-off, the collector thereof will assume a potential which is substantially a −6 volts and this signal will be coupled by way of the resistor 30 and condenser 31 back through the resistor 20 to the base of the transistor 21. Since this signal is a negative signal, it will act regeneratively on the input of the transistor 21 tending to maintain the transistor 21 switched to the conducting state. At the same time, the −6 volt signal appearing at the collector electrode will be reflected into the delay line 27 and will, after a predetermined time delay, appear across the output load resistor 28 and the output terminals 29.

The regenerative feedback by way of resistor 30 and condenser 31 will remain effective for the time duration of the negative clock pulse which is applied to the input terminal 22. As soon as the clock pulse returns to the +3 volt level, the diode 23 will be rendered conducting and consequently the regenerative feedback signal will be decoupled from the base of the transistor 21.

Reference to the wave forms illustrated in FIGURE 2 indicates more fully the manner in which the circuit will tolerate signal variations from the input functions A and B. As shown in FIGURE 2, the input functions A and B are both represented by negative pulses whose voltage swing is from 0 to a −6 volts. As illustrated, the timing of the pulse A is slightly in advance of that of pulse B. To the extent that the pulses are overlapping, the gating circuit of FIGURE 1 will produce the signal $A \cdot B$, likewise swinging from ground potential to a −6 volts. It is this latter signal which is applied to the base of the transistor 21. However, due to the presence of the +3 volt signal from the clock terminal 22, the diode 23 will be conducting to effectively shunt the information signal into the clock source and will not permit the information signal to be applied to the base of the transistor 21 until the clock signal switches to a −6 volts. The −6 volt clock signal will cut the diode 23 off and the current from the information signal will then pass through the diode 17 and flow into the base of the transistor 21 by way of resistor 20 and the apparatus will switch as aforedescribed. Once the clock signal has taken over and the regenerative output from the amplifier transistor 26 is effective on the input, the circuit will continue to remain in a switched state until the clock pulse returns to +3 volts. As pointed out above, as soon as the +3 volt signal appears back on the terminal 22, the regenerative feedback signal is eliminated and the circuit then switches back to its normal quiescent state. The RC time constant of the feedback network including resistor 30 and condenser 31 is preferably selected to be relatively long with respect to the time of the clock pulse.

An analysis of the foregoing operation and description will indicate that the apparatus of the present invention is able to tolerate wide phase differences in the input functions and yet produces a uniform output signal which is dependent primarily upon the uniformity of a clock signal and not upon the wave shape or time duration of the input information signals.

It will be further apparent from an examination of the circuit of the present apparatus that the transistor 26 is functioning in its most desirable mode as a switching device to control the flow of current in the delay line 27. By having the transistor directly coupled to the delay line, it is possible to achieve a desirable signal level relationship which will not distort the output wave forms at the output terminals 29. This combination eliminates any danger of ringback in the circuit.

The addition of the resistor 24 to the circuit combination is for purposes of minimizing the effects of noise or spurious unwanted pulses in the circuit. The +3 volt biasing signal produced by way of the resistor 24 on the base of the transistor 21 normally holds the transistor 21 nonconducting. In one preferred embodiment of the invention, the magnitude of resistor 24 was 10K while the magnitude of the resistor 20 was 1.1K. This ratio of resistance in this particular circuit is such as to not apply an excessively high positive voltage to the base of the transistor 21 to thereby render it insensitive to the normal input information signal.

While, in accordance with the provisions of the statutes, there has been illustrated and described the best form of the invention known, it will be apparent to those skilled in the art that changes may be made in the apparatus described without departing from the spirit of the invention as set forth in the appended claims and that in some cases, certain features of the invention may be used to advantage without a corresponding use of other features.

Having now described the invention, what is claimed as new and novel and for which it is desired to secure Letters Patent is:

1. A pulse reproducing circuit comprising a pair of directly coupled transistor elements connected in cascade, an input connected to one of said transistor elements, said input comprising an external pulse signal source which has an output pulse to be reproduced and an external clock pulse signal source, an output circuit connected as a direct current connection to the other of said transistor elements, and a feedback connection from said output circuit to said input, said clock pulse signal source being connected to said feedback connection to decouple the feedback signal upon the termination of each clock pulse.

2. A pulse reproducing circuit comprising a pair of directly coupled transistor elements connected in cascade, an input connected to one of said transistor elements, said input comprising a pulse signal source which has an output pulse to be reproduced and a clock pulse signal source, an output circuit connected as a direct current connection to the other of said transistor elements, a regenerative feedback connection from said output circuit to said input circuit, said feedback connection comprising a series resistor-condenser circuit directly coupled from an output electrode of one transistor element to an input electrode of the other transistor element, and means for coupling said clock pulse signal source to said feedback connection to control the transmission of feedback signals.

3. A pulse reproducing circuit comprising a pair of directly coupled transistor elements connected in cascade, an input connected to one of said transistor elements, said input comprising an external pulse signal source which has an output pulse to be reproduced and an external clock pulse signal source, an output circuit connected to the other of said transistor elements, a feedback connection from said output circuit to said input circuit, said feedback circuit being connected to said clock pulse source to be decoupled from said input by the clock pulse signals upon the termination thereof, a power source for said pair of transistor elements, and a delay line directly connected by way of a direct current connection between an output electrode of one of said transistor elements and said power source.

4. A pulse amplifying and reshaping circuit comprising a pair of transistor elements each having emitter, base and collector electrodes, means connecting the emitter electrodes of said transistor elements to a common terminal, means directly connecting the collector electrode of one of said transistor elements to the base electrode of the other of said transistor elements, an input circuit connected to the base electrode of said one transistor element, an output circuit connected by way of a direct current connection to the collector electrode of said other transistor element, a direct feedback connection from said output circuit and means for applying clock pulse signals adapted to control the transmission of signals through said feedback connections.

5. A pulse amplifying and reshaping circuit comprising a pair of transistor elements each having an emitter, base and collector, means connecting the emitters of said transistor elements to a common terminal, means directly connecting the collector of one of said transistor elements to the base of the other of said transistor elements, an input circuit connected to the base of said one transistor element, an output circuit connected by way of a direct current connection to the collector of said other transistor element, a regenerative feedback connection from said output circuit to said input circuit, and means for applying clock pulse signals adapted to decouple said feedback connection.

6. A pulse amplifying and reshaping circuit comprising a pair of transistor elements each having an emitter, base and collector, means connecting the emitters of said transistor elements to a common terminal, means connecting the collector of one of said transistor elements to the base of the other of said transistor elements, an input circuit connected to the base of said one transistor element, an output circuit connected by way of a direct current connection to the collector electrode of said other transistor element, a feedback connection from said output circuit to said input circuit, said feedback connection comprising a series connected resistor-condenser circuit connected directly from the collector of said other transistor element to the base of said one transistor element, and a delay line connected directly to the collector of said other transistor element.

7. A circuit as defined in claim 6 wherein said base of said one transistor element has a noise clipping bias voltage coupled thereto.

8. A pulse amplifying and reshaping circuit comprising a pair of directly coupled transistor elements forming an amplifier circuit, an input connected to said amplifier circuit, an external signal source to said input, an output circuit directly connected to said amplifier circuit by way of a direct current connection, said output circuit comprising a delay line, a feedback connection from said output circuit to said input circuit and a clock pulse source connected to said feedback connection to decouple the feedback signal on said feedback connection from said input circuit upon the termination of each clock pulse.

9. A pulse amplifying and reshaping circuit comprising a pair of directly coupled and cascaded transistor elements forming an amplifier circuit, an input connected to said amplifier circuit, an output circuit connected by way of a direct current connection to said amplifier circuit, said output circuit comprising a delay line, a feedback connection from said output circuit to said input circuit, an information pulse source connected to said input, a clock pulse source connected to said input, and diode means coupling said pulse source to said input so that said information pulse source is not effective until said clock pulse source has a clock signal thereon, and said feedback connection is effective only so long as said clock pulse source has a clock signal thereon.

References Cited in the file of this patent

UNITED STATES PATENTS

| | | |
|---|---|---|
| 2,531,164 | Sands | Nov. 21, 1950 |
| 2,659,816 | Fleming-Williams et al. | Nov. 17, 1953 |
| 2,663,806 | Darlington | Dec. 22, 1953 |
| 2,783,456 | Steagall | Feb. 26, 1957 |
| 2,802,118 | Simkins | Aug. 6, 1957 |
| 2,830,179 | Stenning | Apr. 8, 1958 |
| 2,830,199 | Mofenson | Apr. 8, 1958 |
| 2,831,113 | Weller | Apr. 15, 1958 |
| 2,835,828 | Vogelsong | May 20, 1958 |
| 2,838,689 | Clapper | June 10, 1958 |
| 2,870,347 | Jensen | Jan. 20, 1959 |
| 2,879,456 | Pinckaers | Mar. 24, 1959 |
| 2,888,560 | Talambiras | May 26, 1959 |
| 2,929,939 | Ingham | Mar. 22, 1960 |